(12) United States Patent
De Bock et al.

(10) Patent No.: US 12,288,711 B2
(45) Date of Patent: Apr. 29, 2025

(54) METHODS OF OPERATING DIE ATTACH SYSTEMS

(71) Applicant: Assembléon B.V., Eindhoven (NL)

(72) Inventors: Alain De Bock, Neerpelt (BE); René Bouman, Vught (NL)

(73) Assignee: Assembleon B.V., Eindhoven (NL)

( * ) Notice: Subject to any disclaimer, the term of this patent is extended or adjusted under 35 U.S.C. 154(b) by 0 days.

(21) Appl. No.: 18/092,546

(22) Filed: Jan. 3, 2023

(65) Prior Publication Data

US 2023/0148420 A1 May 11, 2023

Related U.S. Application Data

(62) Division of application No. 16/561,224, filed on Sep. 5, 2019, now Pat. No. 11,574,832.

(60) Provisional application No. 62/727,447, filed on Sep. 5, 2018.

(51) Int. Cl.
| | |
|---|---|
| *H01L 21/68* | (2006.01) |
| *H01L 21/67* | (2006.01) |
| *H01L 23/00* | (2006.01) |
| *H01L 23/544* | (2006.01) |

(52) U.S. Cl.
CPC ...... *H01L 21/681* (2013.01); *H01L 21/67144* (2013.01); *H01L 23/544* (2013.01); *H01L 24/75* (2013.01); *H01L 24/83* (2013.01); *H01L 2224/75001* (2013.01); *H01L 2224/75702* (2013.01); *H01L 2224/75753* (2013.01); *H01L 2224/75755* (2013.01); *H01L 2224/83132* (2013.01); *H01L 2224/8318* (2013.01)

(58) Field of Classification Search
CPC ......... H01L 21/67132; H01L 21/67144; H01L 21/681; H01L 2224/75001; H01L 2224/75312; H01L 2224/75702; H01L 2224/75753; H01L 2224/75755
See application file for complete search history.

(56) References Cited

U.S. PATENT DOCUMENTS

| | | | |
|---|---|---|---|
| 9,431,365 B2 | 8/2016 | Seok et al. | |
| 2003/0148420 A1* | 8/2003 | Suzanne | A61P 29/00 435/254.2 |
| 2015/0380380 A1 | 12/2015 | Schmidt-Lange et al. | |

(Continued)

FOREIGN PATENT DOCUMENTS

| | | |
|---|---|---|
| JP | 2016058543 | 4/2016 |
| KR | 10-2016-0032594 A | 3/2016 |

(Continued)

OTHER PUBLICATIONS

International Search Report completed Dec. 4, 2019 for PCT International Application No. PCT/EP2019/073766.

*Primary Examiner* — Minh N Trinh
(74) *Attorney, Agent, or Firm* — Christopher M. Spletzer, Sr.

(57) ABSTRACT

A method of operating a die attach system is provided. The method includes the step of providing a verification substrate configured to receive a plurality of die, the verification substrate including a plurality of substrate reference markers. The method also includes the step of imaging each of the plurality of die with respective ones of the plurality of substrate reference markers using an imaging system of the die attach system for determining an alignment of the plurality of die with the verification substrate.

15 Claims, 10 Drawing Sheets

(56) References Cited

U.S. PATENT DOCUMENTS

2016/0276205 A1 9/2016 Huska et al.
2019/0304852 A1 10/2019 Seyama

FOREIGN PATENT DOCUMENTS

TW        201814819     4/2018
WO   WO2004032207     4/2004

* cited by examiner

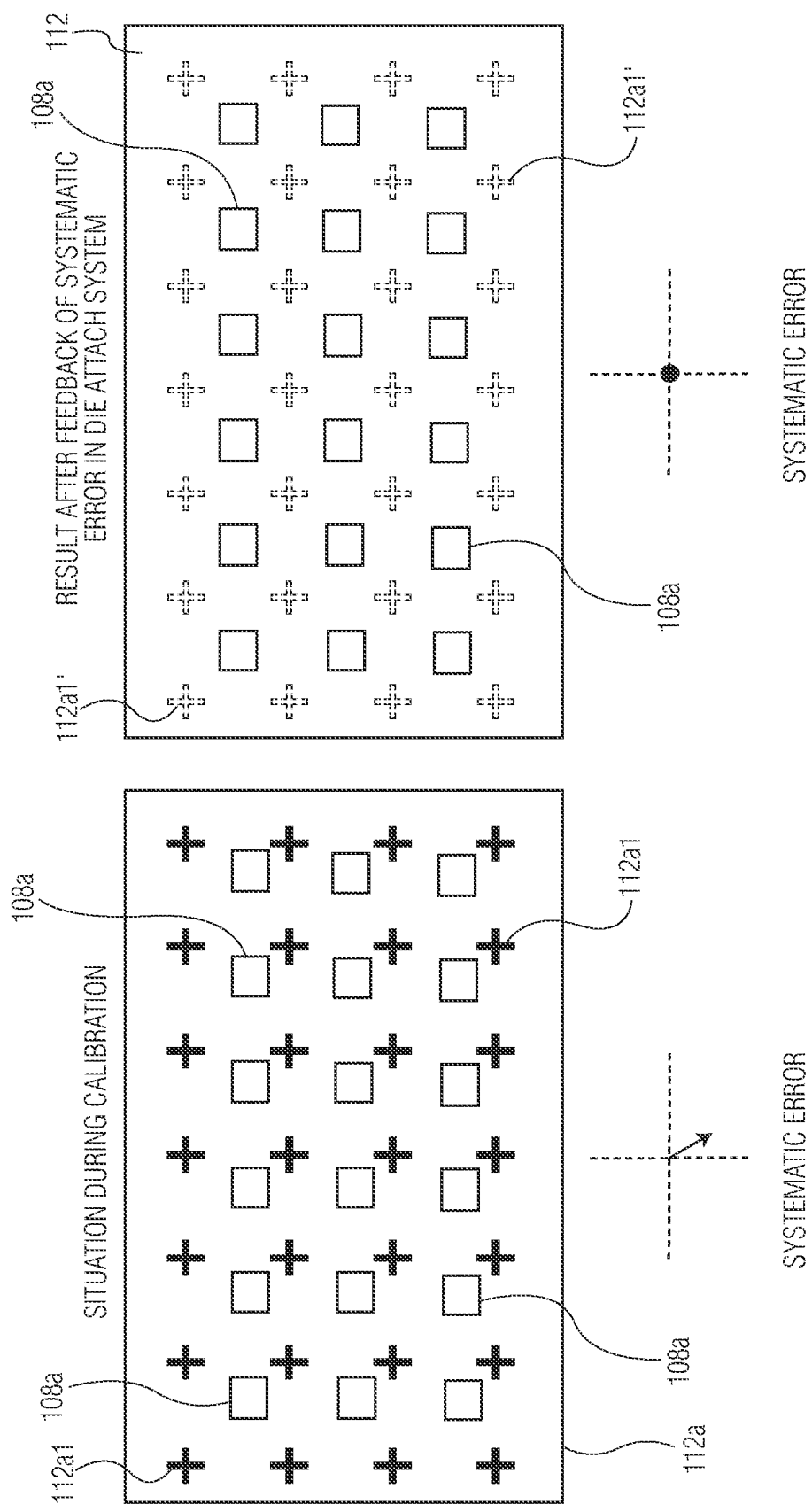

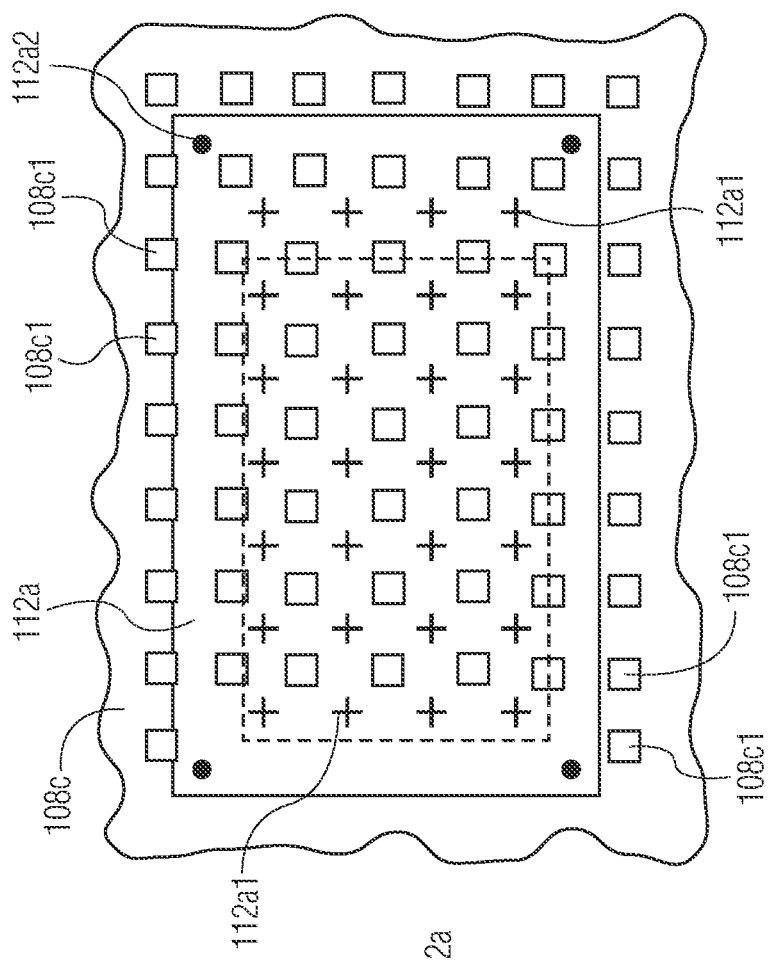
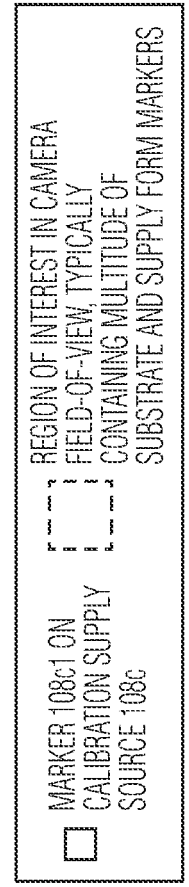
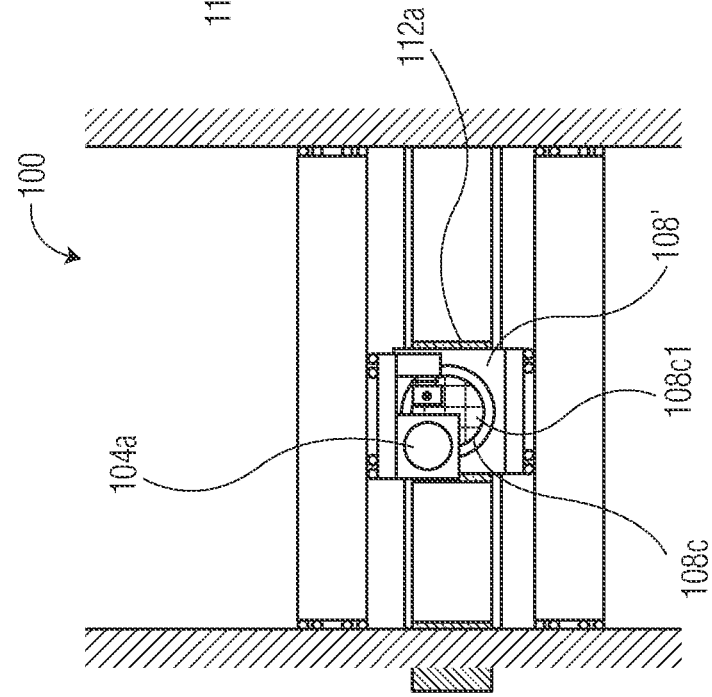
FIG. 9A
FIG. 9B

METHODS OF OPERATING DIE ATTACH SYSTEMS

CROSS-REFERENCE TO RELATED APPLICATION

This application is a divisional application of U.S. patent application Ser. No. 16/561,224, filed Sep. 5, 2019, which claims the benefit of U.S. Provisional Application No. 62/727,447, filed Sep. 5, 2018, the content of both of which is incorporated herein by reference.

FIELD

The invention relates to systems and methods for attaching a die to substrate, and more particularly, to improved systems and methods for accuracy verification and calibration for a die attach system.

BACKGROUND

In connection with the placement of a die on a substrate (e.g., the placement of a semiconductor die on a substrate), many conventional applications utilize a "pick and place" operation. In such operations, a die is "picked" from a semiconductor wafer or other die supply source, and then the die is moved to (and "placed" on) a target substrate. Such operations may also utilize one or more transfers between a "pick" tool and a "place" tool.

Certain die attach applications do not utilize a pick and place operation. For example, a die supply source (e.g., a wafer including a plurality of die) may be positioned between a bond tool and a substrate. Die included in the die supply source may be attached to a film or the like. After alignment between the bond tool, the die to be attached, and a placement location of the substrate—the bond tool presses the die against the placement location of the substrate.

Accuracy of a die attach operation tends to be performed after the operation is complete, using equipment separate from the die attach system. Such accuracy determinations tend to be time consuming and costly. Thus, it would be desirable to provide improved systems and methods for verifying the accuracy of die attach operations, and similar processes.

SUMMARY

According to an exemplary embodiment of the invention, a die attach system is provided. The die attach system includes a verification substrate configured to receive a plurality of die, the verification substrate including a plurality of substrate reference markers. The die attach system also includes an imaging system for determining an alignment of the plurality of die with the verification substrate by imaging each of the plurality of die with respective ones of the plurality of substrate reference markers.

According to another exemplary embodiment of the invention, a method of operating a die attach system is provided. The method includes the steps of: providing a verification substrate configured to receive a plurality of die, the verification substrate including a plurality of substrate reference markers; and imaging each of the plurality of die with respective ones of the plurality of substrate reference markers using an imaging system of the die attach system for determining an alignment of the plurality of die with the verification substrate.

According to yet another exemplary embodiment of the invention, another die attach system is provided. The die attach system includes: a die supply source holding a die supply form including a first plurality of reference markers; a first motion system for moving the die supply source; a bond head including a bond tool and an imaging system; a second motion system for moving the bond head; a substrate including a second plurality of reference markers; and wherein the imaging system is configured for imaging ones of the first plurality of reference markers and ones of the second plurality of reference markers in a single field of view.

According to yet another exemplary embodiment of the invention, a method of calibrating a die attach machine is provided. The method includes the steps of: providing a calibration die supply form including a calibration die supply, the calibration die supply including a first plurality of reference markers; providing a bond head including a bond tool and an imaging system; providing a substrate including a second plurality of reference markers; and imaging ones of the first plurality of reference markers and ones of the second plurality of reference markers in a single field of view with an imaging system of a die attach machine.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

FIGS. 7A-7B are top view illustrations of a calibration operation in accordance with an exemplary embodiment of the present invention;

FIGS. 9A-9B are top view diagrams illustrating a calibration operation in accordance with an exemplary embodiment of the present invention.

DETAILED DESCRIPTION

Figure 1A:
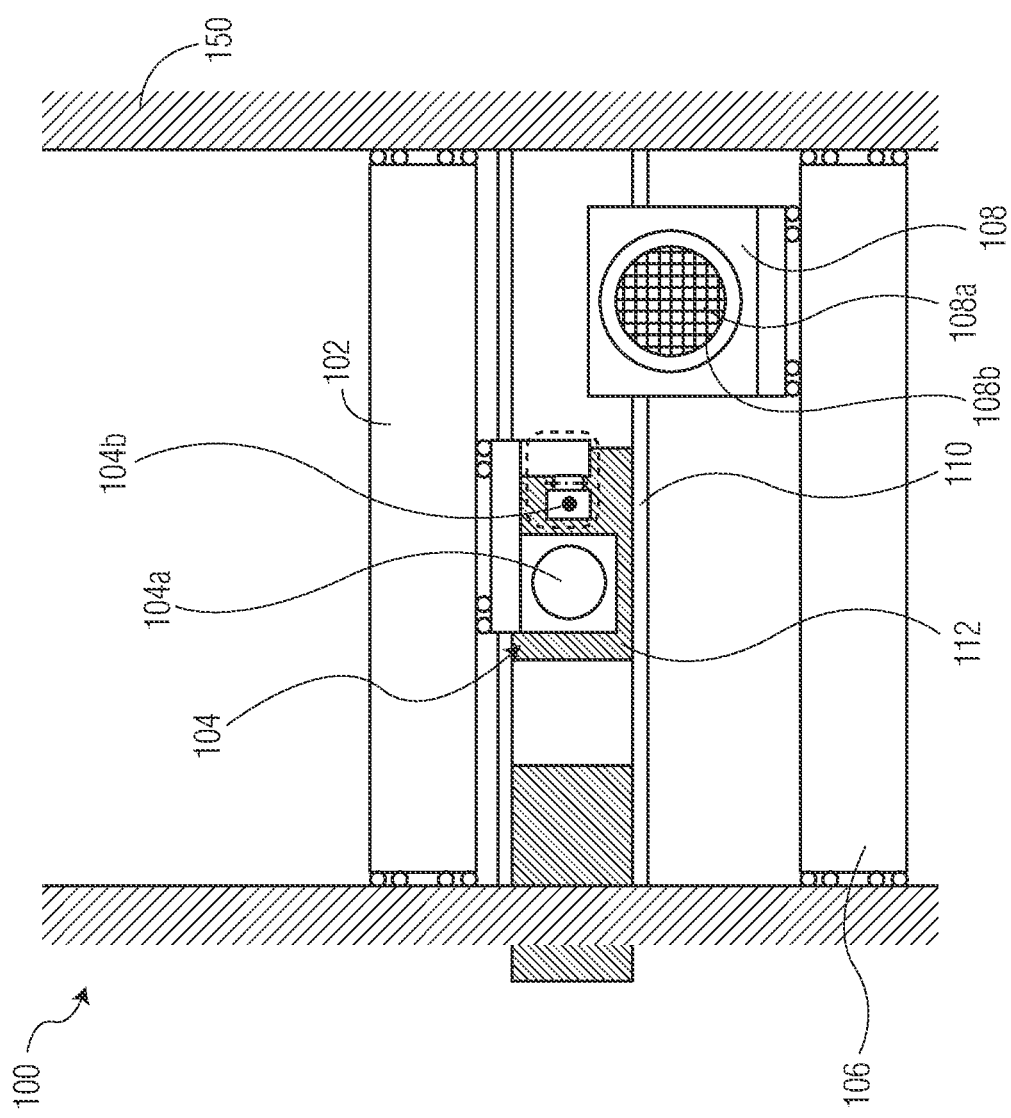
FIG. 1A is a block diagram top view of elements of a die attach system in accordance with an exemplary embodiment of the present invention.

As used herein, the term "die" is intended to refer to any structure including (or configured to include at a later step) a semiconductor chip or die. Exemplary "die" elements include a bare semiconductor die (such as a bare LED semiconductor die), a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, amongst others.

As provided above, certain die attach applications do not utilize a pick and place operation. For example, a die supply source (e.g., a wafer including a plurality of die, such as an LED wafer of other source of LED die) may be positioned between a bond tool and a substrate. The die supply source may include a plurality of die (e.g., an LED die) attached to a film or the like. Transfer of the die from the die supply source to the substrate may be accomplished using a number of processes. Two exemplary processes are described below.

According to a first exemplary process, after alignment of the bond tool, the die to be attached, and a placement location of the substrate—the bond tool presses the die against the placement location of the substrate. Adhesive on a lower surface of the die (and/or on the placement location of the substrate) is provided such that the die is now secured to the substrate. Such bond tools may include a needle, a plurality of pins (e.g., separably actuatable pins), etc. for contacting the die in connection with a transfer from the die supply source to the substrate.

According to a second exemplary process, after alignment of the bond tool, the die to be attached, and a placement location of the substrate—a laser or other light source (e.g., where the laser may be carried by the bond head) is used to transfer the die from the die supply source to the substrate. Adhesive on a lower surface of the die (and/or on the placement location of the substrate) is provided such that the die is now secured to the substrate.

While two exemplary processes are described above, it will be appreciated that other transfer processes are contemplated. Regardless of the transfer process, aspects of the invention may be utilized to improve the relevant die attach system and related processes.

According to certain exemplary embodiments of the present invention, accuracy verification may be integrated into a die attach system, for example, using a camera of the die attach system. Conventional substrates or dedicated substrates may be used for die attachment. Dedicated substrates have high relative accuracy of local references versus global substrate alignment references. Exemplary dedicated substrates include state-of-the-art glass substrates with lithographically applied reference markers, or metal substrates with laser engraved references. The camera (or other imaging system) of a die attach system may be used to register the x, y, and theta deviations of attached dies versus their respective substrate references. By imaging both the substrate reference and the die in the same camera image field-of-view, measurement errors are minimized and typically only depend on the quality of the camera and the relative accuracy of the substrate reference markers.

Thus, aspects of the invention may relate to obtaining x, y, and theta deviation data. Such deviation data may be used, for example: (i) to assemble an accuracy report on the die attach system; (ii) to determine systematic deviations and feed back into the system to improve the die attach accuracy; and (iii) to derive diagnostic information to invest root cause for accuracy related non-conformities.

This is different from conventional systems, for example, in that die attach accuracy related verification and calibration is integrated with the system that is used to attach the dies.

This is a significant improvement as compared to conventional systems and methods because, for example, additional measurement equipment (and related management) is not required to obtain the accuracy data. Shorter calibration/verification loops may be provided because of the integration with the die attach system itself.

Referring now to the drawings, FIG. 1A illustrates a die attach system 100. Die attach system 100 includes a support structure 110 for supporting a substrate 112, a die supply source 108 including a plurality of die 108a (where the plurality of die 108a are provided on a film/foil 108b included as part of die supply source 108) configured to be attached to substrate 112, and a bond head 104 including a bond tool 104b for contacting die 108a during a transfer of die 108a from die supply source 108 to substrate 112. Die attach system 100 also include a bond head support 102 and a supply support 106. Bond head support 102 and supply support 106 are each mounted on machine structure 150 such that bond head support 102 and supply support 106 are independently moveable relative to machine structure 150. Bond head support 102 supports moveable bond head 104. Bond head support 102 includes a motion system (e.g., a robot) for moving bond head 104 along the x, y directions. Bond head 104 includes a camera 104a (and other visions system components) for use in connection with alignment and/or inspection operations. Die supply source 108 is moveably mounted on supply support 106. Supply support 106 includes a motion system (e.g., a robot) for moving die supply source 108 along the x, y directions. In the exemplary embodiment of the invention shown in FIG. 1A (and in FIG. 1B), during a die attach operation, die supply source 108 is positioned between bond tool 104b and substrate 112 supported by support structure 110.

Figure 1B:
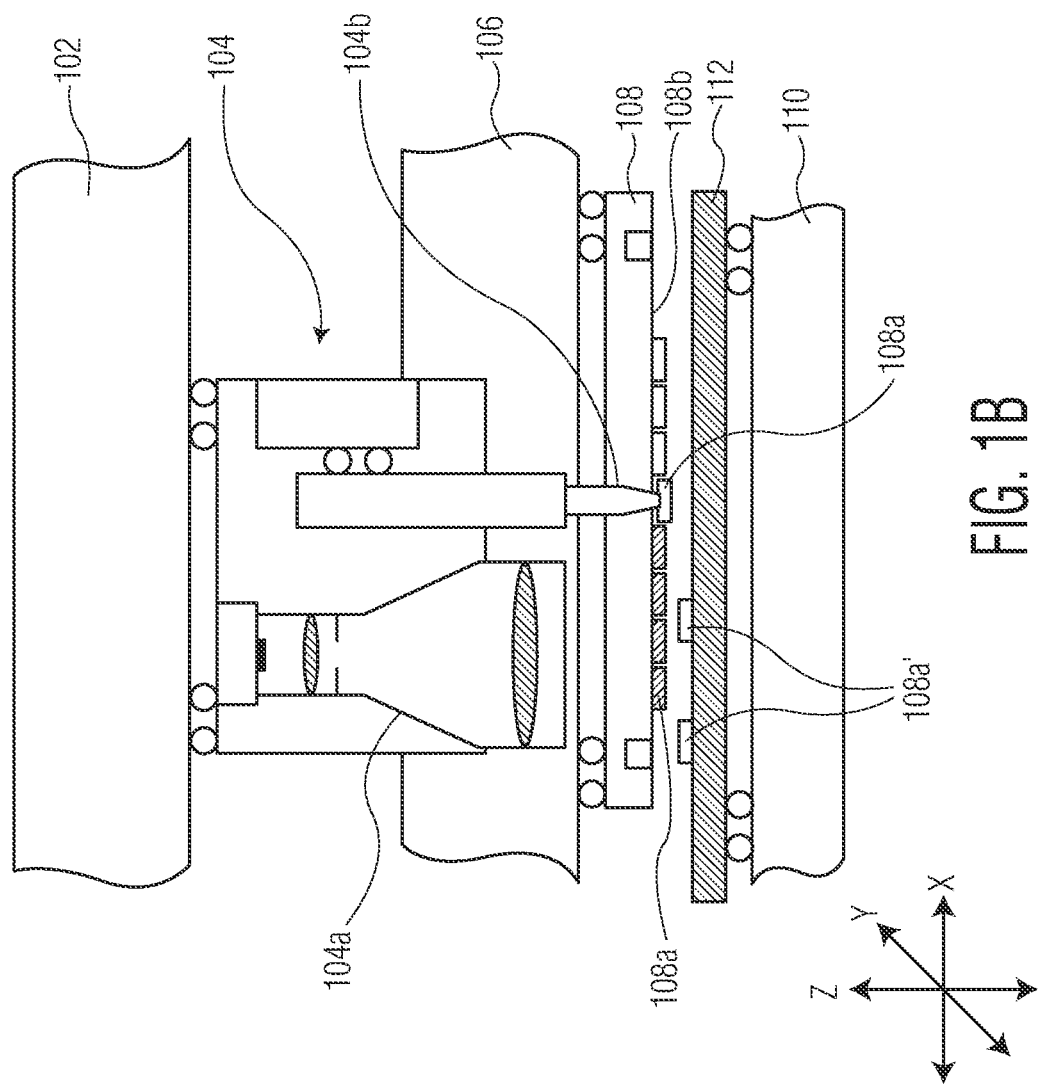
FIG. 1B is a side view of elements of the die attach system of FIG. 1A.

As compared to FIG. 1A, the side (partial cross sectional) view of FIG. 1B illustrates bond head 104 (including camera 104a and bond tool 104b) having been moved to a position over die 108a which, in turn, is positioned over substrate 112. Two "bonded" die 108a' have been attached to substrate 112 at respective bonding locations and bond tool 104b is shown engaging another die 108a above a third respective bonding location on substrate 112. Bond tool 104b (e.g., including a needle, a plurality of pins, etc.) presses die 108a against the third bonding location on substrate 112 to complete another transfer.

While FIGS. 1A-1B utilize a bond tool 104b for completing transfer of ones of a plurality of die 108a from a film 108b to substrate 112, other types of transfer are contemplated (e.g., the aforementioned laser transfer).

FIGS. 1A-1B illustrate substrate 112, which is a substrate for use in connection with typical die attach processes. Aspects of the invention utilize verification substrates useful in connection with operations such as (i) die attach accuracy verification, (ii) pre bond alignment, (iii) calibration operations, among others. Exemplary verification substrates are labelled herein with reference number "112a". In exemplary embodiments of the invention, verification substrate 112a is utilized in connection with a die attach machine (e.g., die attach machine 100 shown in FIGS. 1A-1B). In connection with certain exemplary methods described herein, verification substrate 112a will be located on support structure 110 of die attach system 100 (in place of substrate 112 from FIGS. 1A-1B).

Figure 2:
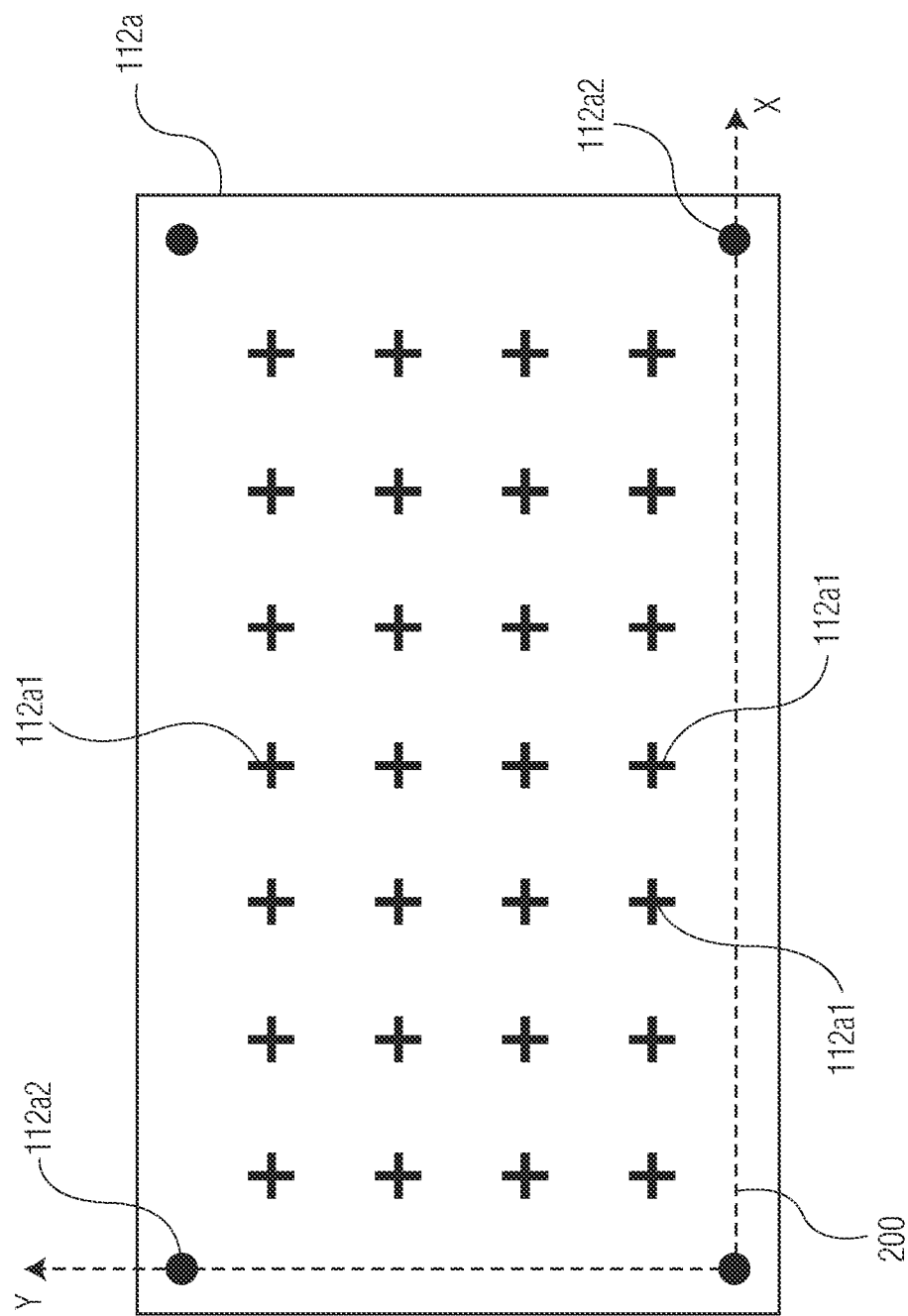
FIG. 2 is a top view of a verification substrate in accordance with an exemplary embodiment of the present invention.

FIG. 2 illustrates verification substrate 112a. Verification substrate 112a includes a plurality of local substrate reference markers 112a1, and a plurality of global alignment reference markers 112a2. Verification substrate 112a may be a glass substrate, a metal substrate, etc. Reference markers 112a1, 112a2 may be lithographically applied reference markers, laser engraved reference markers, among other types of reference markers. Accuracy performance (e.g., in the x, y, and theta dimensions) of a die attach system (such as die attach system 100) may be provided relative to verification substrate 112*a*. Relative measurements taken by a camera of a die attach system (e.g., camera 104*a* of die attach system 100) may be converted using verification substrate 112*a*. Such measurements may also involve reference coordinate system 200 also shown in FIG. 2, where reference coordinate system is an xy coordinate system of a die attach system (e.g., die attach system 100).

Figure 3:
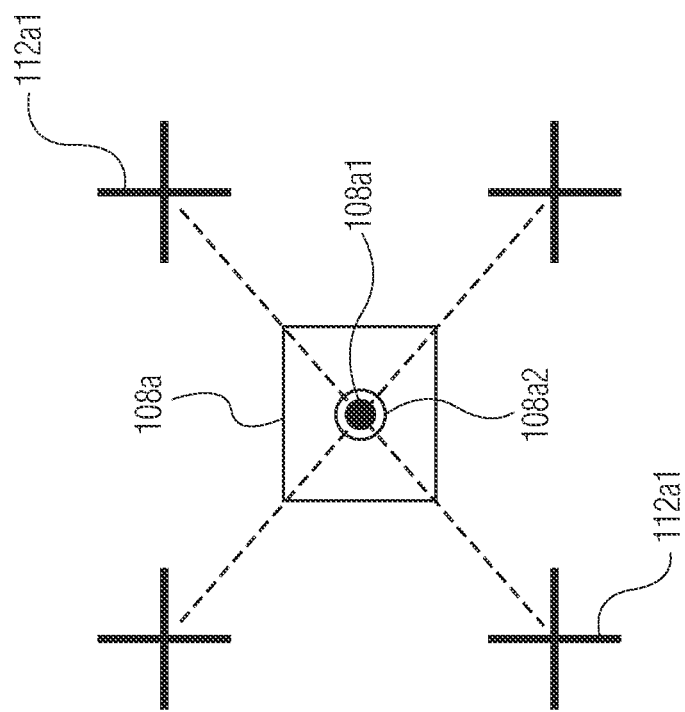
FIG. 3 is a top view of a portion of the substrate of FIG. 2, indicating an ideal die attach location, in accordance with an exemplary embodiment of the present invention.

FIG. 3 illustrates an exemplary die 108*a* attached to a die attach location on verification substrate 112*a*. More specifically, die 108*a* is attached between four (4) local substrate reference markers 112*a*1 on verification substrate 112*a*. In FIG. 3, die 108*a* is shown at an ideal location. FIG. 3 shows a die center 108*a*1 centered within a theoretical ideal location 108*a*2 for die center 108*a*1 (where ideal location 108*a*2 is, in the example shown in FIG. 3, at a center of substrate reference markers 112*a*1).

Figure 4:
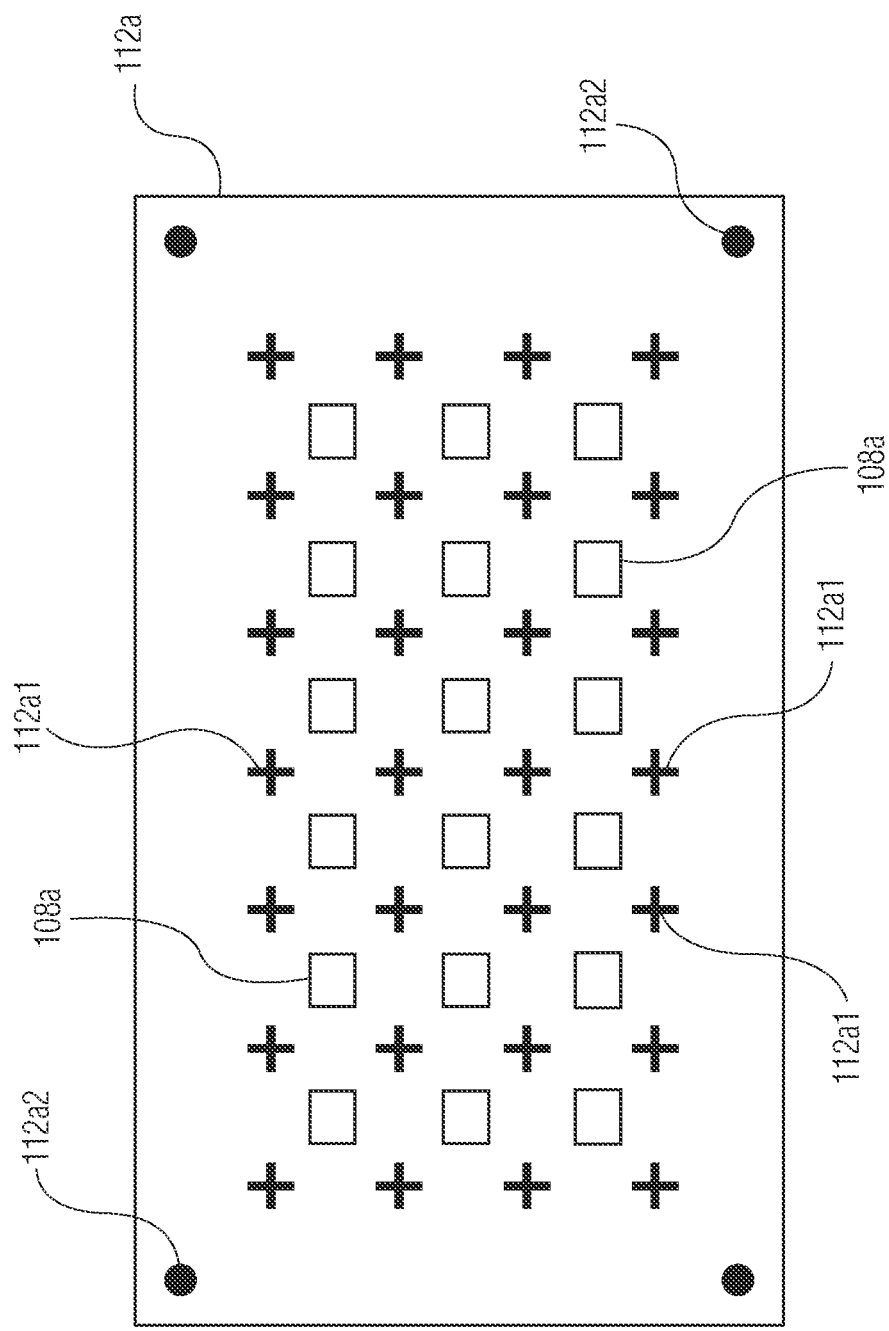
FIGS. 4-6 are top view illustrations of a verification substrate used in connection with a die placement accuracy process in accordance with an exemplary embodiment of the present invention.
Figure 5:
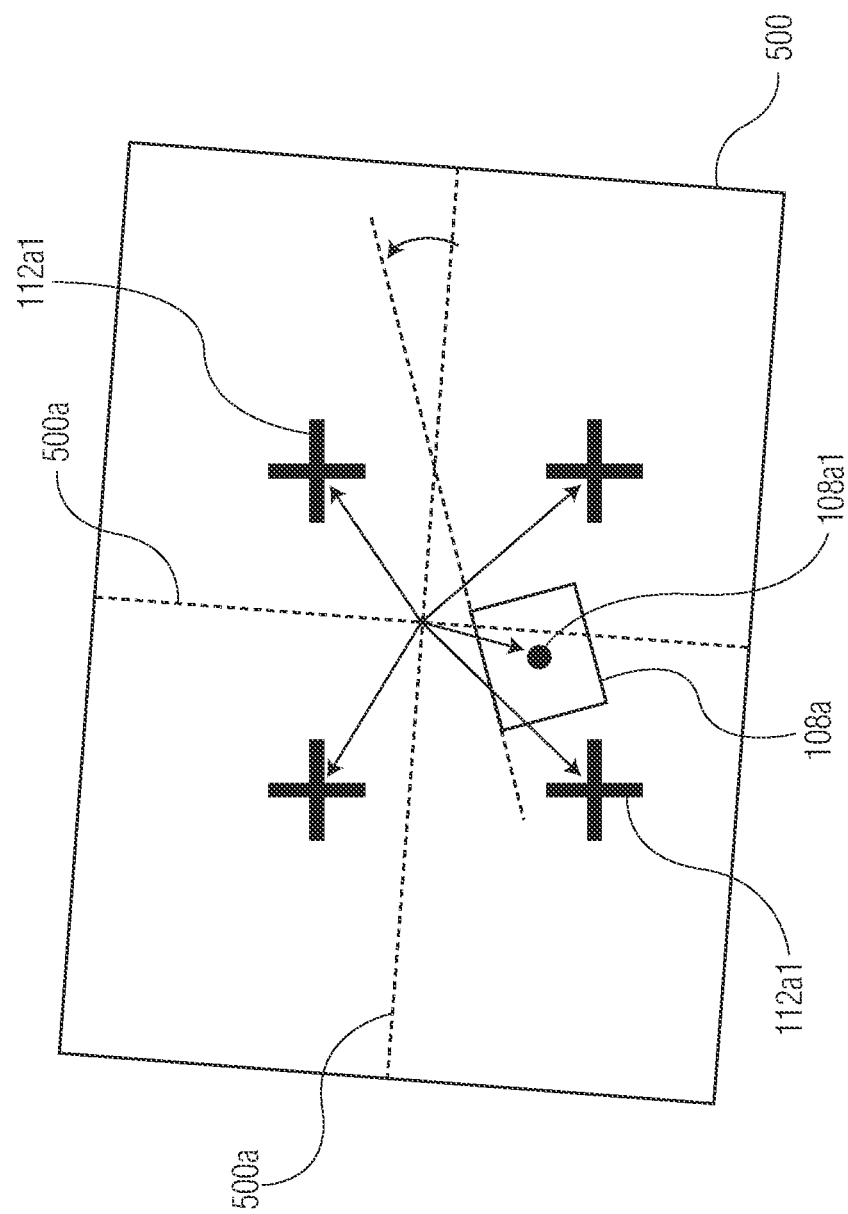
Figure 6:
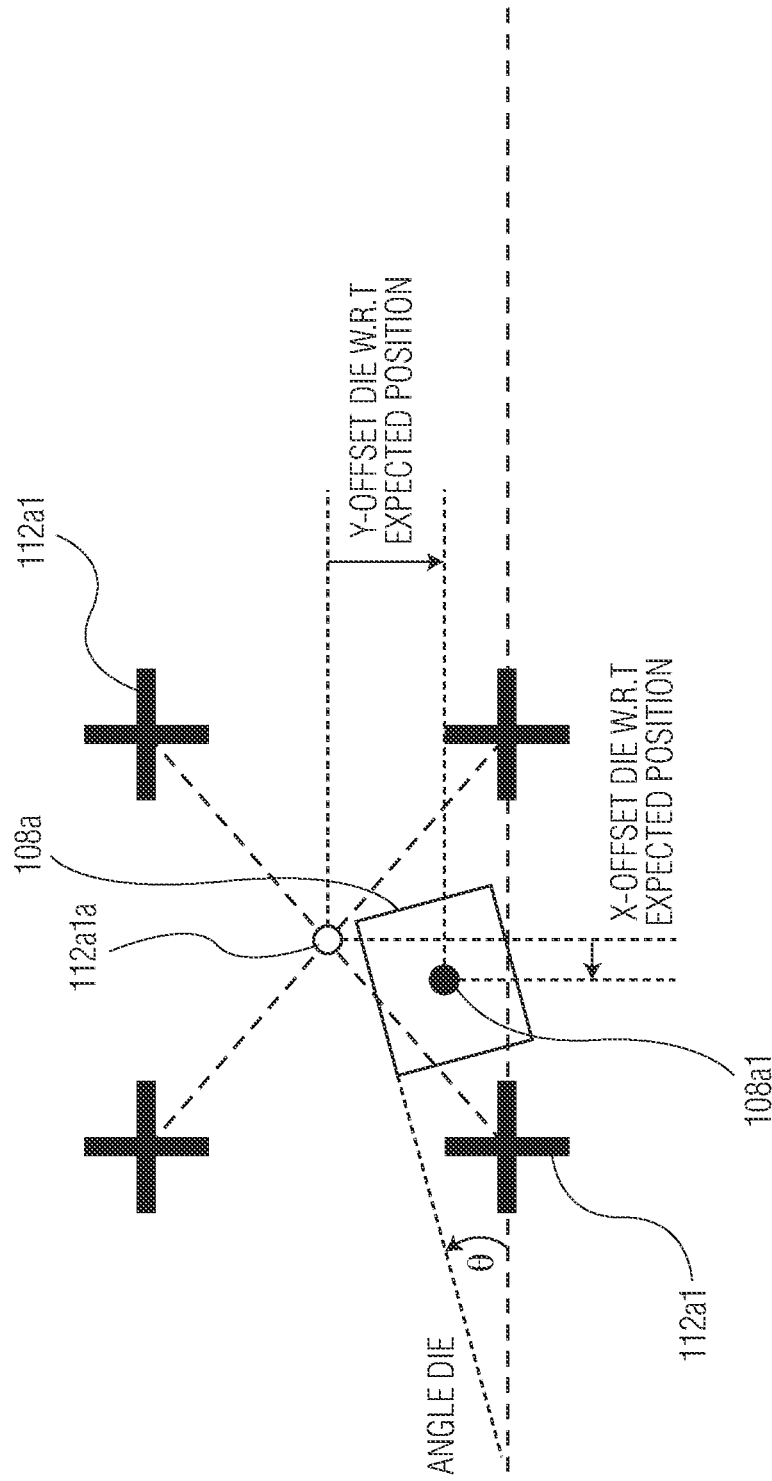

FIGS. 4-6 illustrate steps of a method of determining (and/or verifying) the accuracy of a die attach operation. FIG. 4 illustrates a plurality of die 108*a* attached to bonding locations (target locations) of verification substrate 112*a*. For example, the plurality of die 108*a* may be attached to verification substrate 112*a* using die attach machine 100 shown in FIGS. 1A-1B (e.g., using bond tool 104*b*). The die attach process may be accomplished by imaging one or more plurality of global alignment reference markers 112*a*2 before bonding. The relative location of the local substrate reference markers 112*a*1 to the global alignment reference markers 112*a*2 is accurately known (e.g., either by prior measurement or precise manufacturing).

FIG. 5 illustrates a field of view 500 (e.g., taken with a camera of a die attach system, such as die attach system 100), including measurement axes 500*a*. After the plurality of die 108*a* are attached to verification substrate 112*a* (as in FIG. 4), images are taken of each bonded die 108*a* and its corresponding local substrate reference markers 112*a*1 in a single field of view, as shown in FIG. 5. This imaging (using field of view 500) results in initial measurement results obtained in the camera measurement coordinate system. While FIG. 5 shows a single field of view measurement of a single die 108*a* bonded to a portion of verification substrate 112*a*, it is understood that multiple images may be taken of multiple bonded die 108*a*.

After the imaging of FIG. 5, the location of die 108*a* relative to the local substrate reference system (including local substrate reference markers 112*a*1, center point 112*a*1*a*) is determined, as shown in FIG. 6. As shown in FIG. 6, the measurement results are illustrated after conversion to the substrate reference system, which typically involves de-rotation of the camera angle relative to the substrate. This makes measurement results invariant to incidental camera orientation and position. As shown in FIG. 6, in addition to an angular theta deviation (about the theta axis shown in FIG. 6), an x-offset and a y-offset are determined.

While FIGS. 4-6 illustrate a method of determining the accuracy of die placement on a substrate (which may be used as feedback for corrections in future die placement operations), other improvements may be provided in accordance with the inventive systems and methods described herein. FIGS. 7A-7B illustrate a method of determining (and correcting) systematic deviations in a die attach operation. Such a systematic error is typically obtained as the mean or median value of the measured die-offsets. FIG. 7A illustrates a plurality of die 108*a* bonded to verification substrate 112*a* (where the die are bonded on a die attach machine, such as die attach machine 100 including bond tool 104*b*). As can be seen in FIG. 7A, each of the plurality of die 108*a* are offset from desired bonding location between adjacent local substrate reference markers 112*a*1 (the systematic error is illustrated in FIG. 7A as an offset that is off center from the cross at the bottom of FIG. 7A).

After determining (and/or applying) the systematic error (for example, by correcting for a mean or median die offset), another bonding operation may be completed. FIG. 7B illustrates the plurality of die 108*a* bonded to a substrate 112 (e.g., see substrate 112 shown in FIG. 1A) after feedback from the systematic error determination. In FIG. 7B, the local substrate reference markers 112*a*1' are shown in "phantom" format because they are likely not on substrate 112 (as they would be on verification substrate 112*a*). Nonetheless, the feedback results in improved bonding as shown in FIG. 7B, with the bonded die 108*a* more accurately placed between adjacent local substrate reference markers 112*a*1' (the systematic error is illustrated in FIG. 7B as being corrected, with a "dot" centered on the cross at the bottom of FIG. 7B). Of course, it is understood that the feedback may be accomplished by bonding the die 108*a* to another verification substrate 112*a* to confirm the improved accuracy (as opposed to the substrate 112 shown in FIG. 7B).

Figure 8B:
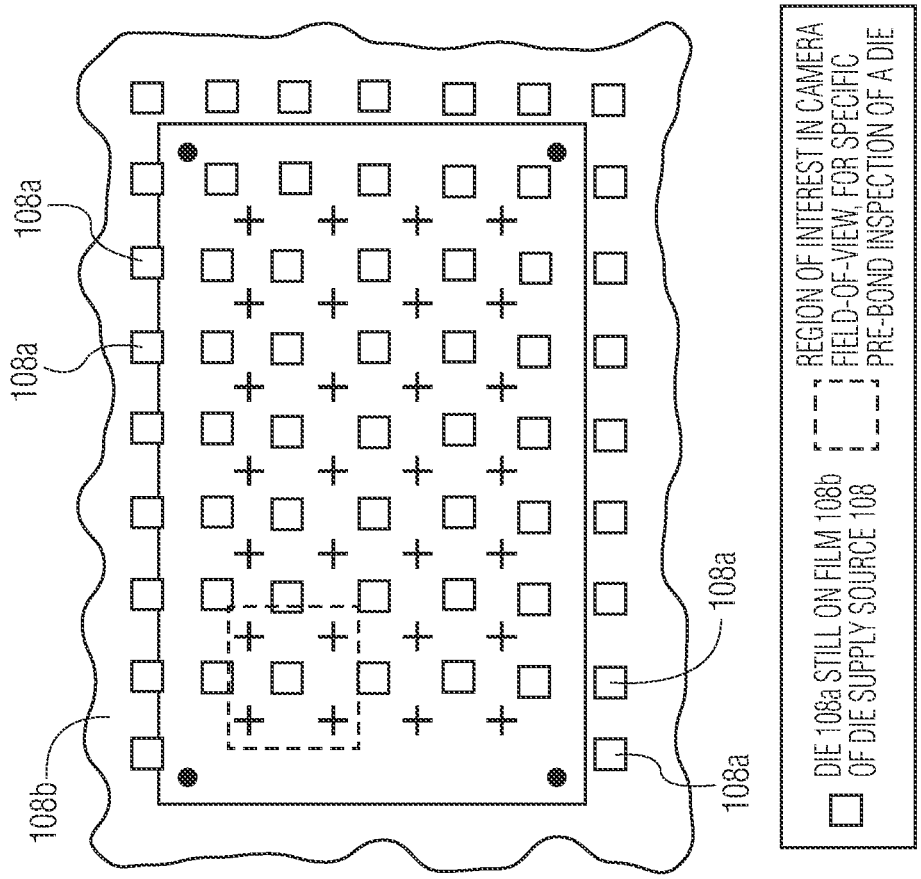
FIGS. 8A-8B are top view diagrams illustrating an pre-bond inspection operation in accordance with an exemplary embodiment of the present invention.
Figure 8A:
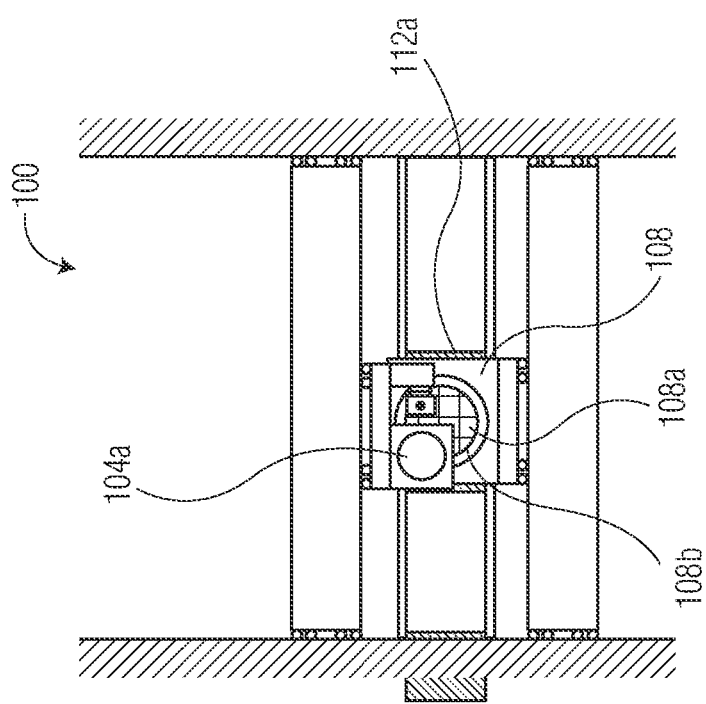

In addition to the die attach accuracy verification of FIGS. 4-6, and the systematic error determination and correction shown in FIGS. 7A-7B, additional embodiments of the invention are contemplated. For example, certain accuracy related diagnostics may be performed within the scope of the invention. FIGS. 8A-8B illustrate an example of such a diagnostic technique in connection with a pre-bond accuracy inspection. FIG. 8A is a block diagram view of die attach system 100 where camera 104*a* is imaging a die 108*a* while still attached to film 108*b*. That is, the imaging is performed before a die attach operation is completed. The plurality of die 108*a* are still on the film 108*b* of die supply source 108. The film is typically transparent (or semi transparent, or translucent), such that the markers of a substrate below the film are well visible and can be measured accurately. In FIGS. 8A-8B, verification substrate 112*a* is positioned below die supply source 108 (where the plurality of die 108*a* are still on film 108*b*). More specifically, die supply source 108 (and/or verification substrate 112*a*) is moved such that at least one of the plurality of die is positioned above a corresponding bonding location of verification substrate 112*a* (i.e., between respective local substrate reference markers 112*a*1). In this orientation, a field of view of the camera is imaged to show the relative position of the die 108*a* to the respective local substrate reference markers 112*a*1. FIG. 8B illustrates a single die 108*a* in such a field of view. Using the image taken from this field of view, accuracy data may be obtained before the die attach process occurs. This image data may be used as feedback to correct for any accuracy issue.

In another exemplary method of the invention, FIGS. 9A-9B illustrates a calibration operation (e.g., a robot stage calibration). The principle of relative marker offset measurement can be applied to robot stage calibration (where a robot stage is a portion of the die attach machine being moved by a motion system such as bond head 104 being moved by a motion system, or die supply source 108 being moved by another motion system). In connection such a robot stage calibration, typical non-linear deviations of robot axes are measured as function of the x,y location in the work-area of the robot stage. For the robot stage having a downwards looking camera (e.g., bond head 104 being moved by a motion system of bond head support 102), the substrate marker measurements can be used directly to create a so called error map of the robot stage. For the robot stage without the downwards looking camera (e.g., die supply source 108 being moved by a motion system of supply support 106), a similar error map can be obtained using the camera of the other stage (e.g., camera 104a) as a measurement device. For this purpose, a calibration die supply form is inserted in place of an actual die supply source, where an exemplary calibration die supply form includes a lithographically manufactured glass plate with markers (a so called "calibration wafer"). The deviations of the calibration die supply form are obtained by measuring the relative offsets of the supply form markers with respect to the substrate reference markers. This may done on various locations covering the work area of the robot stage. Both robot stages can thus be calibrated to the same calibration reference, at the same time. Typically, multiple markers in one field-of-view are used for this purpose (both on substrate and supply form), creating a more accurate and robust measurement capability of positional and angular offsets.

Referring to the specific example shown in FIGS. 9A-9B, a calibration die supply form 108' is provided in place of the die supply source 108 in other drawings provided herein. Calibration die supply form 108' holds calibration die supply 108c including supply form markers 108c1. While these supply form markings are square (similar to the shape of die 108a from previous drawings), any type of supply form marker shape is contemplated. Substrate 112a (including substrate reference markers 112a1, 112a2) is positioned below calibration die supply form 108'. In this configuration, camera 104a may be used to measure the relative offsets of the supply form markers 108c1 with respect to the substrate reference markers 112a1 and/or 112a2. The relative offsets may be used in connection with the robot stage calibration of each of the robot stages (e.g., bond head 104 being moved by a motion system of bond head support 102, and die supply source 108 being moved by a motion system of supply support 106) as described above.

While the invention has been described and illustrated primarily with respect to die attach operations where there is no "pick" operation, it is not limited thereto. The invention has broad applicability in the semiconductor bonding industry including die attach machines (sometimes referred to as die bonders) or other packaging machines (e.g., flip chip machines/operations, advanced packaging operations, etc.).

While exemplary embodiments of the invention are illustrated and described with respect to markers having certain shapes (e.g., cross shaped markers, round markers, rectangular markers, etc.), and certain numbers of markers with respect to a single die (e.g., four substrate reference markers 112a1 surrounding each die), etc.—these types of details are exemplary in nature, and non-limiting with respect to the scope of the invention.

Although the invention has been described and illustrated with respect to the exemplary embodiments thereof, it should be understood by those skilled in the art that the foregoing and various other changes, omissions and additions may be made therein and thereto, without parting from the spirit and scope of the present invention. Rather, various modifications may be made in the details within the scope and range of equivalents of the invention and without departing from the invention.

What is claimed:

1. A method of operating a die attach system, the method comprising steps of:
    providing the die attach system, the die attach system including (i) a verification substrate configured to receive a plurality of die, the verification substrate including a plurality of substrate reference markers, (ii) an imaging element, (iii) a bond tool configured to contact each of the plurality of die during a transfer from a die supply source to the verification substrate, and (iv) a supply support for supporting the die supply source, the die supply source being positioned between the bond tool and the verification substrate;
    imaging each of the plurality of die with respective ones of the plurality of substrate reference markers in a single field-of-view using the imaging element from the die attach system; and
    determining an alignment of the plurality of die with the verification substrate using an image taken during imaging of each of the plurality of die with respective ones of the plurality of substrate reference markers.

2. The method of claim 1 wherein imaging each of the plurality of die with respective ones of the plurality of substrate reference markers includes imaging each of the plurality of die using the imaging element including a camera.

3. The method of claim 1 wherein, in connection with determining the alignment of the plurality of die with the verification substrate using the image taken during imaging of each of the plurality of die with respective ones of the plurality of substrate reference markers, a positional deviation is determined between each of the plurality of die with the respective ones of the plurality of substrate reference markers using image data from the imaging system.

4. The method of claim 3 wherein determining the alignment of the plurality of die with the verification substrate using the image taken during imaging of each of the plurality of die with respective ones of the plurality of substrate reference markers includes determining the positional deviation along an x-axis of the die attach machine, along a y-axis of the die attach machine, and about a theta axis of the die attach machine.

5. The method of claim 1 wherein the image taken during imaging of each of the plurality of die with respective ones of the plurality of substrate reference markers includes the single field-of-view including each of the plurality of die and each of the plurality of substrate reference markers.

6. The method of claim 1 wherein determining the alignment of the plurality of die with the verification substrate using the image taken during imaging of each of the plurality of die with respective ones of the plurality of substrate reference markers includes determining a placement accuracy of each of the plurality of die after placement on the verification substrate.

7. The method of claim 1 further comprising providing the verification substrate to include a glass verification substrate.

8. The method of claim 1 wherein an alignment determined by determining the alignment of the plurality of die with the verification substrate using the image taken during imaging of each of the plurality of die with respective ones of the plurality of substrate reference markers is a pre bond alignment determined prior to bonding of each of the plurality of die to a substrate, where each of the plurality of die is positioned above the verification substrate during the pre bond alignment.

9. The method of claim 8 further comprising providing each of the plurality of die adhered to a film of the die supply source.

10. The method of claim 1 further comprising providing a support structure for supporting the verification substrate.

11. The method of claim 1 further comprising providing the verification substrate with the plurality of substrate reference markers including (i) a global alignment reference marker and (ii) a local substrate reference marker.

12. The method of claim 1 further comprising providing the verification substrate with the plurality of substrate reference markers including (i) a plurality of global alignment reference markers and (ii) a plurality of local substrate reference markers.

13. The method of claim 1 further comprising providing the verification substrate with the plurality of substrate reference markers including (i) a global alignment reference marker and (ii) a plurality of local substrate reference markers including at least four local substrate reference markers.

14. The method of claim 13 wherein imaging each of the plurality of die with respective ones of the plurality of substrate reference markers includes imaging one of the plurality of die placed between the at least four local substrate reference markers.

15. The method of claim 1 wherein determining an alignment of the plurality of die with the verification substrate using the image taken during imaging of each of the plurality of die with respective ones of the plurality of substrate reference markers includes determining a systematic error from an offset of a plurality of die bonded to the verification substrate.

* * * * *